US012744504B2

(12) United States Patent
Gale et al.

(10) Patent No.: US 12,744,504 B2
(45) Date of Patent: Sep. 22, 2026

(54) CONFIGURABLE MULTI-POLAR RF ABLATION PROBE

(71) Applicant: DIXI Neurolab, Inc., Oxford, MI (US)

(72) Inventors: John Thomas Gale, Myrtle Beach, SC (US); Ronald Leon Kurtz, Manotick (CA)

(73) Assignee: DIXI Neurolab, Inc., Crown Point, IN (US)

( * ) Notice: Subject to any disclaimer, the term of this patent is extended or adjusted under 35 U.S.C. 154(b) by 898 days.

(21) Appl. No.: 18/049,849

(22) Filed: Oct. 26, 2022

(65) Prior Publication Data

US 2023/0126626 A1 Apr. 27, 2023

Related U.S. Application Data

(60) Provisional application No. 63/263,048, filed on Oct. 26, 2021.

(51) Int. Cl.
*H03H 7/38* (2006.01)
*H05B 6/48* (2006.01)

(52) U.S. Cl.
CPC ................ *H03H 7/38* (2013.01); *H05B 6/48* (2013.01)

(58) Field of Classification Search
CPC ........ A61B 18/148; A61B 2018/00446; A61B 2018/00577; A61B 2018/00666; A61B 2018/00875; A61B 2018/124; A61B 2018/126; H03H 7/38; H05B 6/48
See application file for complete search history.

(56) References Cited

U.S. PATENT DOCUMENTS

| | | | |
|---|---|---|---|
| 7,094,231 | B1 | 8/2006 | Ellman et al. |
| 2002/0022864 | A1 | 2/2002 | Mahvi et al. |
| 2005/0043727 | A1 | 2/2005 | Swanson et al. |
| 2007/0129726 | A1 | 6/2007 | Eder et al. |

(Continued)

FOREIGN PATENT DOCUMENTS

| | | | |
|---|---|---|---|
| EP | 2366352 | A1 | 9/2011 |
| EP | 2942023 | A2 | 11/2015 |
| WO | 2008014465 | A2 | 1/2008 |

OTHER PUBLICATIONS

International Search Report for PCT Application No. PCT/US2022/078704, dated Mar. 1, 2023.

*Primary Examiner* — Tigist S Demie
(74) *Attorney, Agent, or Firm* — Intrinsic Law Corp.

(57) ABSTRACT

A lesion control system includes a radio-frequency (RF) generator that produces RF energy having a predetermined frequency and power; a controller comprising a microprocessor; a multi-polar RF ablation probe having a plurality of electrical contacts; a plurality of RF input lines electrically coupled to an output terminal of the RF generator; a plurality of RF output lines, each RF output line electrically coupled to a respective one or more of the electrical contacts in the multi-polar RF ablation probe; an RF return line electrically coupled to a return terminal of the RF generator; and a plurality of switches, each switch having a respective terminal electrically coupled to a respective RF output line, each switch electrically coupled to the controller. The controller is configured to produce switch control signals that change a respective state of one or more of the switches to set a configuration of the multi-polar RF ablation probe.

13 Claims, 13 Drawing Sheets

(56) References Cited

U.S. PATENT DOCUMENTS

| | | | | |
|---|---|---|---|---|
| 2008/0221565 | A1* | 9/2008 | Eder | A61B 18/1442 606/40 |
| 2009/0125011 | A1 | 5/2009 | Behzadian | |
| 2010/0114095 | A1* | 5/2010 | Janssen | A61B 90/30 606/41 |
| 2017/0049513 | A1 | 2/2017 | Cosman, Jr. et al. | |
| 2017/0164998 | A1 | 6/2017 | Klimovitch | |
| 2017/0304642 | A1 | 10/2017 | Ron Edoute et al. | |

* cited by examiner

CONFIGURABLE MULTI-POLAR RF ABLATION PROBE

CROSS-REFERENCE TO RELATED APPLICATIONS

This application claims priority to U.S. Provisional Application No. 63/263,048, titled "Multi-Polar RF Ablation and Controls to Optimize Ablation Geometries," filed on Oct. 26, 2021, which is hereby incorporated by reference.

TECHNICAL FIELD

This application relates generally to medical devices for radio-frequency (RF) ablation of target tissue.

BACKGROUND

RF ablation therapy is used to form lesions in a subject to treat a medical condition. For example, RF ablation is currently used as a therapeutic option for the treatment of neurological disorders such as Parkinson disease, essential tremor, epilepsy, brain tumors, and chronic pain. Outside of its neurological applications, RF ablation is also used to treat a variety of cancer conditions, including bone and liver cancers, as well as to treat certain cardiac conditions.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a lesion control system comprising: a radio-frequency (RF) generator that produces RF energy having a predetermined frequency and power; a controller comprising a microprocessor; a multi-polar RF ablation probe having a plurality of electrical contacts; a plurality of RF input lines electrically coupled to an output terminal of the RF generator; a plurality of RF output lines, each RF output line electrically coupled to a respective one or more of the electrical contacts in the multi-polar RF ablation probe; an RF return line electrically coupled to a return terminal of the RF generator; and a plurality of switches, each switch having a respective terminal electrically coupled to a respective RF output line, each switch electrically coupled to the controller, wherein the controller is configured to produce switch control signals that change a respective state of one or more of the switches to set a configuration of the multi-polar RF ablation probe.

In one or more embodiments, the controller is configured to produce first control signals that cause a first one or more of the switches to transition to an RF power-connected state in which the first one or more of the switches electrically couple one or more respective RF output lines to one or more respective RF input lines to form one or more respective positive contacts. In one or more embodiments, the controller is configured to produce second control signals that cause a second one or more of the switches to transition to an RF return-connected state in which the second one or more of the switches electrically couple one or more respective RF output lines to the RF return line to form one or more respective negative contacts. In one or more embodiments, the controller is configured to produce third control signals that cause a third one or more of the switches to transition to a disconnected state in which the third one or more of the switches is/are electrically decoupled from one or more respective RF input lines and from the RF return line to form one or more disconnected contacts.

In one or more embodiments, the switch control signals are first switch control signals, and the controller is configured to produce second switch control signals during an RF ablation therapy to dynamically change the configuration of the multi-polar RF ablation probe.

In one or more embodiments, the system further comprises: a plurality of variable impedance matching circuits; a plurality of impedance detectors, each impedance detector having an input electrically coupled to an output of a respective variable impedance matching circuit and an output electrically coupled to an input of the controller, wherein each variable impedance matching circuit and each variable impedance matching circuit are electrically coupled to a respective RF input line. In one or more embodiments, each impedance detector is configured to measure a respective measured impedance of the respective one or more of the electrical contacts and to send a respective output signal to the controller that represents the respective measured impedance of the respective one or more electrical contacts, and the controller is configured to send respective impedance control signals to each variable impedance matching circuit to set an impedance of the respective RF output line based on the respective measured impedance.

In one or more embodiments, the respective impedance control signals cause each variable impedance matching circuit to match the impedance of the respective RF output line to the respective measured impedance. In one or more embodiments, the respective impedance control signals cause each variable impedance matching circuit to vary the impedance of the respective RF output line to balance a current flow to the electrical contacts. In one or more embodiments, the respective impedance control signals cause each variable impedance matching circuit to vary the impedance of the respective RF output line to unevenly flow current to the electrical contacts. In one or more embodiments, the controller is configured to produce a stop signal when the respective measured impedance is higher than a predetermined threshold impedance.

Another aspect of the invention is directed to a method for operating a multi-polar radio-frequency (RF) ablation probe, comprising: producing RF energy, with an RF generator, having a predetermined frequency and power; directing the RF energy through a plurality of RF input lines that are electrically coupled to an output terminal of the RF generator; with one or more first switches, selectively electrically coupling a respective one or more first electrical contacts in the multi-polar RF ablation probe to a respective RF input line to form one or more positive electrical contacts; with one or more second switches, selectively electrically coupling a respective one or more second electrical contacts in the multi-polar RF ablation probe to an RF return line to form one or more negative electrical contacts, the RF return line electrically coupled to a return terminal of the RF generator; and directing the RF energy from the one or more positive electrical contacts to the one or more negative electrical contacts to produce a therapeutic RF electric field.

In one or more embodiments, the method further comprises with one or more third switches, selectively electrically decoupling one or more third electrical contacts in the multi-polar RF ablation probe from the respective RF input line and from the RF return line to form one or more disconnected electrical contacts. In one or more embodiments, the method further comprises while producing the therapeutic RF electric field, changing a state of a first one of the first switches from (a) an RF power-connected state in which the first one of the first switches electrically couples the respective one or more first electrical contacts to the respective RF input line to (b) an RF return-connected state in which the first one of the first switches electrically couples the respective one or more first electrical contacts to the RF return line, whereby a polarity of the respective one or more first electrical contacts is dynamically changed. In one or more embodiments, the method further comprises producing, with a microprocess-based controller electrically coupled to the one or more first switches and to the one or more second switches, first and second switch control signals to set a state of the one or more first switches and a state of the one or more second switches.

In one or more embodiments, a respective variable impedance matching circuit and a respective impedance detector are electrically coupled to each RF input line, and the method further comprises: measuring an impedance, with the impedance detectors, of a respective first electrical contact(s) and of a respective second electrical contact(s); and with a microprocess-based controller having an input electrically coupled to an output of each impedance detector to receive a respective measured impedance from each impedance detector, sending a respective impedance control signal to each variable impedance matching circuit to set an impedance of a respective RF output line based on the respective measured impedance, each RF output line electrically coupled to (a) a respective first switch and the respective one or more first electrical contacts or (b) a respective second switch and the respective one or more second electrical contacts. In one or more embodiments, the respective impedance control signal causes each variable impedance matching circuit to match the impedance of the respective RF output line to the impedance of the respective first electrical contact(s) or the respective second electrical contact(s) that is/are electrically coupled to the respective RF output line.

In one or more embodiments, the respective impedance control signal causes each variable impedance matching circuit to vary the impedance of each respective RF output line to vary a current flow to the respective first and second electrical contacts. In one or more embodiments, the method further comprises monitoring, with the controller, the impedance of the respective first electrical contact(s) and the impedance of the respective second electrical contact(s) during an RF ablation therapy procedure; and stopping, with the controller, the RF ablation therapy procedure when the impedance of any of the respective first electrical contact(s) or the impedance of any of the respective second electrical contact(s) is higher than a predetermined threshold impedance.

Another aspect of the invention is directed to a method for performing radio-frequency (RF) ablation therapy, comprising: inserting a multi-polar RF ablation probe into a subject, the multi-polar RF ablation probe including a plurality of electrical contacts; selectively electrically coupling at least a first electrical contact in the RF ablation probe to a respective RF input line that is electrically coupled to an output terminal of an RF generator to form at least a positive electrical contact; selectively electrically coupling at least a second electrical contact in the RF ablation probe to an RF return line that is electrically coupled to a return terminal of the RF generator to form at least a negative electrical contact; producing RF energy with the RF generator to perform RF ablation therapy using the positive and negative electrical contacts; and dynamically changing a configuration of the electrical contacts while performing the RF ablation therapy.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

A multi-polar RF ablation probe includes a plurality of electrical contacts that are configurable prior to and/or during RF ablation therapy. The electrical contacts can be configured as positive electrical contacts, negative electrical contacts, or inactive electrical contacts. The positive electrical contacts are selectively electrically coupled to an output terminal of an RF generator to receive RF energy and current therefrom. The negative electrical contacts are selectively electrically coupled to a return terminal of an RF generator to complete the electrical circuit. The inactive electrical contacts are electrically decoupled from the output terminal and the return terminal of the RF generator.

A plurality of switches (e.g., a switch matrix) can selectively electrically couple or decouple the electrical contacts. Each switch has a respective terminal that is electrically coupled to one or more respective electrical contacts. Each switch can be in a first state in which the respective electrical contact(s) is/are electrically coupled to the output terminal of the RF generator (e.g., via a respective RF input line). Each switch can be in a second state in which the respective electrical contact(s) is/are electrically coupled to the return terminal of the RF generator (e.g., via an RF return line). Each switch can be in a third state in which the respective electrical contact(s) is/are electrically decoupled from the output and return terminals.

The state of the switches can be controlled by switch control signals produced by a microprocessor-based controller.

In some embodiments, the impedance of the electrical contacts can be measured with impedance detectors. Each impedance detector can be electrically coupled to a respective RF input line. The impedance detectors can produce output signals representing the measured impedance which can be sent as inputs to the controller. The controller can vary the impedance of lines that are electrically coupled to the electrical contacts by sending impedance control signals to variable impedance matching circuits. Each to variable impedance matching circuit can be electrically coupled to a respective RF input line. The impedance of the respective RF input line can be set to match the measured impedance of the respective electrical contact(s) or to be different than the measured impedance of the respective electrical contact(s). Varying the impedance of the respective RF input line can cause the RF energy to be distributed evenly or unevenly from the electrical contacts.

Figure 1:
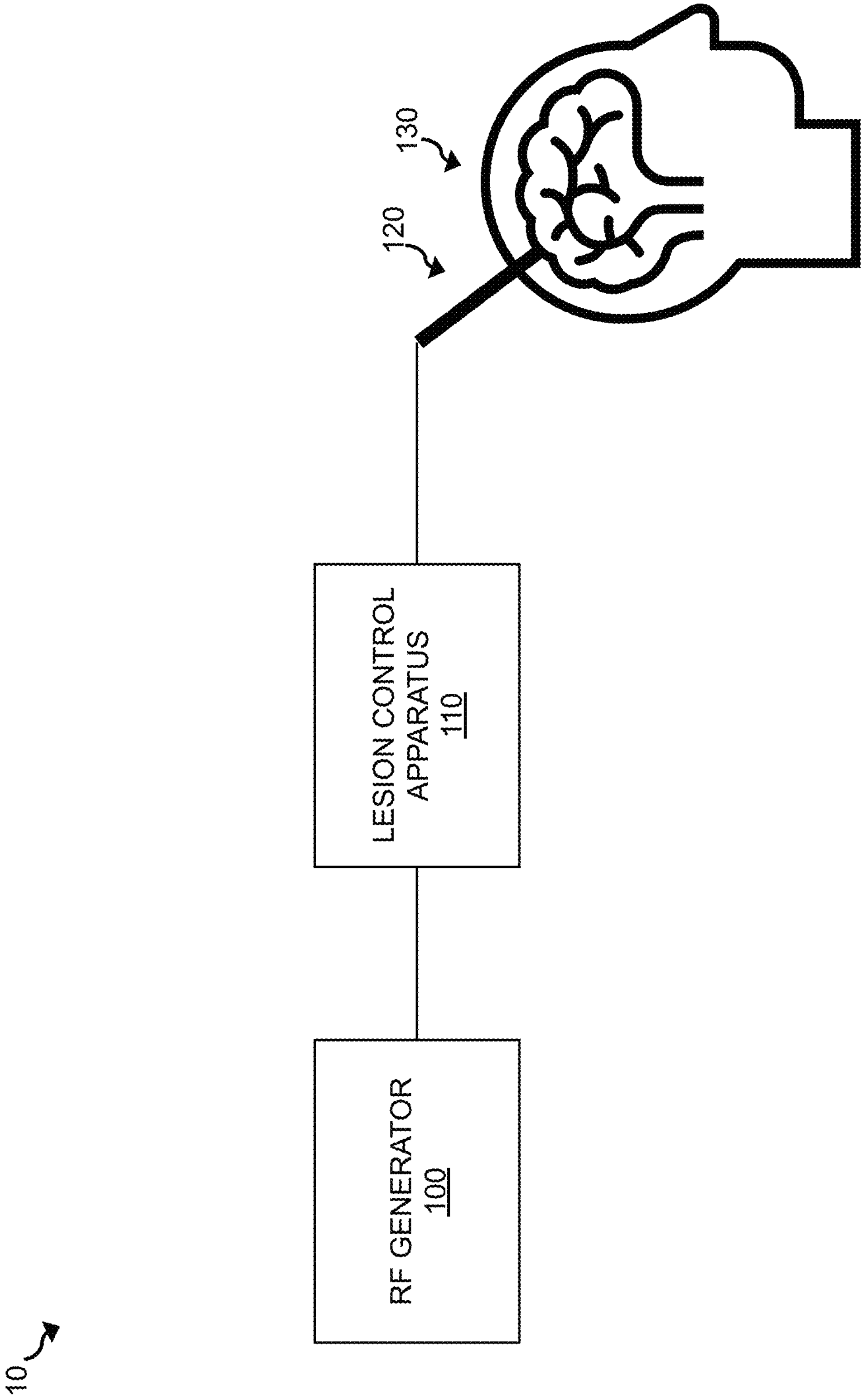
FIG. 1 is a block diagram of an RF ablation system according to an embodiment.

FIG. 1 is a block diagram of an RF ablation system 10 according to an embodiment. The system 10 includes an RF generator 100, a lesion control apparatus 110, and a multi-polar RF ablation probe 120, which can be inserted into a subject 130 for RF ablation therapy. For example, the probe 120 can be inserted into the brain to perform a stereoelectroencephalography (SEEG).

The RF generator 100 is configured to produce RF energy or signals having a predetermined frequency (or frequency range) and power. The RF energy is provided to the lesion control apparatus 110, which includes circuitry and/or program instructions that cause the RF energy to be selectively sent to the contacts in the probe 120. The RF signals preferably have the same frequency.

The lesion control apparatus 110 can include a user interface (e.g., mechanical and/or electronic controls) that allows a user to set the power or current of the RF signals, to set the frequency of the RF signals, and/or to manually start and stop RF ablation therapy (e.g., by selectively starting and stopping the power or current flow to the probe 120). The user interface can also allow the user to set and/or vary the number of contacts in the probe 120 to which the RF signals are sent and the polarity of each contact. The user interface can also allow the user to designate which contacts on the probe 120 and/or contacts on adjacent probes receive the RF signals from the RF ablation system 10, which governs the size and/or shape of the lesion created during RF ablation therapy. Likewise, the user interface can allow the user to define the type of contact configuration in probe 120 to use for the ablation (i.e. mono-, bi-, tri- or another multi-polar configuration).

In addition to designating which contacts on probe 120 receive the signal from the RF ablation system 10, the lesion control apparatus 110 is designed to adjust the load impedance for specific contacts, thereby adjusting the amplitude and phase, to optimize the size or shape of the desired lesion. Adjusting the load impedance can also be used to vary the amount of current or power sent to each contact. For example, the load impedance can be varied to balance or equalize the amount of current or power sent to each contact. Alternatively, the load impedance can be varied to direct more current or power to one or more contacts compared to the other contacts (or vice versa).

The lesion control apparatus 110 can also include one or more controls to automatically stop the RF ablation therapy prior to or when cavitation of the tissue occurs in the tissue, which can cause damage to the subject 130 and/or to the probe 120.

Figure 2:
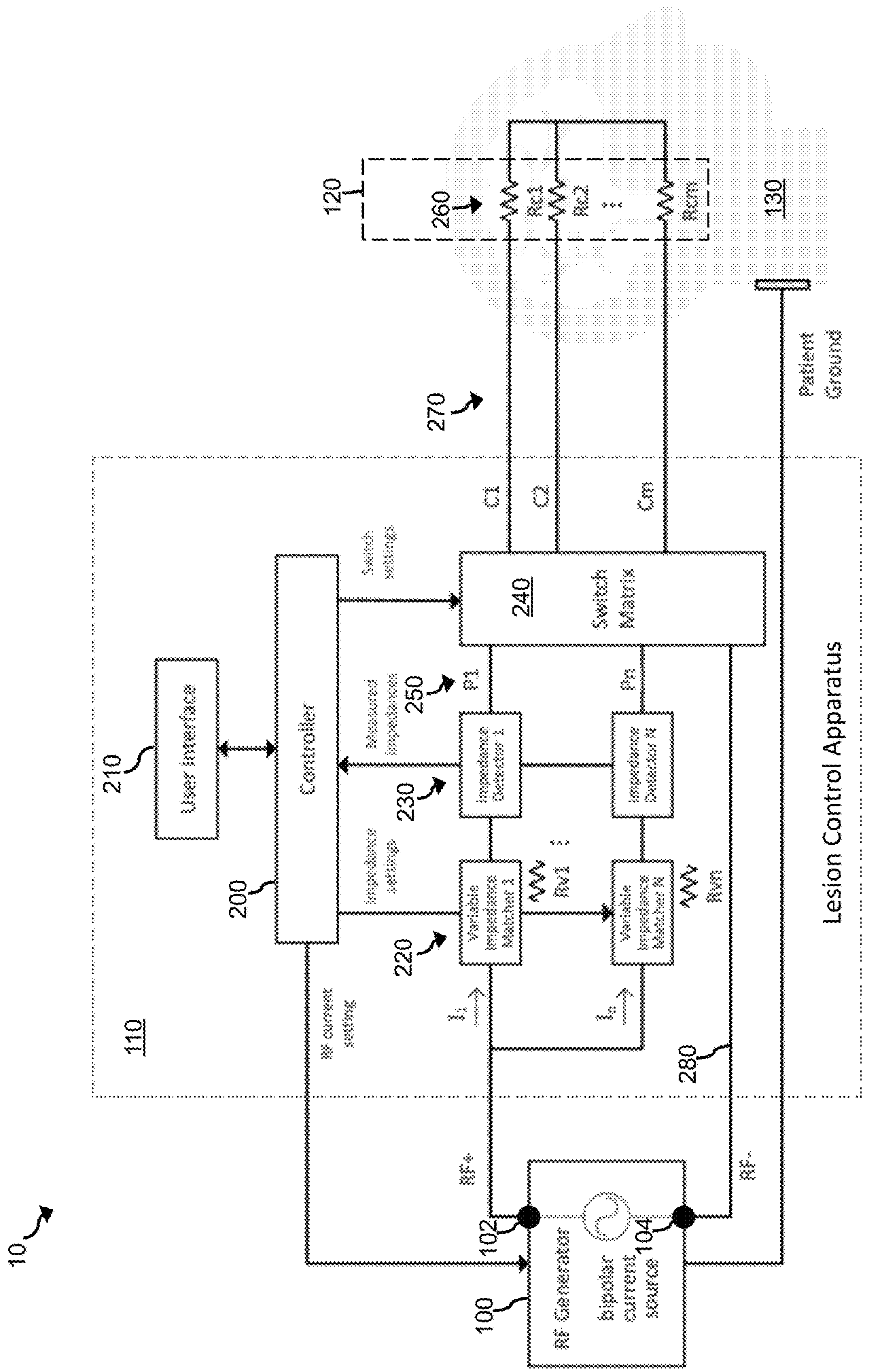
FIG. 2 is a detailed block diagram of RF ablation system illustrated in FIG. 1 according to an embodiment.

FIG. 2 is a detailed block diagram of system 10 according to an embodiment. In this embodiment, the lesion control apparatus 110 includes a controller 200, a user interface 210, a plurality of variable impedance matching circuits 220, a plurality of impedance detectors 230, and a switch matrix 240. The impedance detectors 230 can be replaced with or can include electrical load detectors. The variable impedance matching circuits 220 and impedance detectors 230 are optional in some embodiments.

The controller 200 includes a microprocessor and non-transitory computer memory that stores software and/or other computer-readable instructions for performing one or more tasks.

The user interface 210 includes mechanical and/or electronic controls for setting one or more parameters of the system 10. For example, the user interface 210 can include controls for setting the power, current, voltage, and/or frequency of the RF signals produced by the RF generator 100. The user interface 210 can also include controls for manually starting and/or stopping RF ablation therapy (e.g., by starting and/or stopping the power or current flow to the probe 120). The user interface 210 can also include controls for setting and/or varying the number of contacts 260 in the probe 120 to which the RF signals are sent. The user interface 210 can also include controls for configuring the polarity of the contacts 260 in the probe 120. The user interface can also allow the user to designate which contacts 260 on the probe 120 and/or contacts on adjacent probes receive the RF signals from the RF ablation system 10, which governs the size and/or shape of the lesion created during RF ablation therapy. Likewise, the user interface can allow the user to define the type of contact configuration in probe 120 to use for the RF ablation therapy (i.e. mono-, bi-, tri-, or another multi-polar configuration).

In operation, the RF generator 100 receives an input signal from the controller 200 to set the RF current, power, voltage, and/or frequency according to one or more settings input by a user via the user interface 210. The RF signals are sent from the RF generator 100 to a plurality (N) of variable impedance matching circuits 220 that are electrically connected in with parallel each other. The respective output of each variable impedance matching circuit 220 is electrically coupled to an input of a respective impedance detector 230. Each impedance detector 230 is electrically coupled to a respective switch in switch matrix 240 via a respective RF input line 250. The RF input lines 250 are electrically coupled to an output terminal 102 of the RF generator 100.

Each switch (e.g., in switch matrix 240) can be in a connected state in which either (a) a respective RF output line 270 is electrically coupled to a respective RF input line 250 such that one respective contact(s) 260 (represented as a resistor or RC circuit Rcm in FIG. 2) receive positive RF power (e.g., to form positive electrical contacts) or (b) the respective RF output line 270 is electrically coupled to an RF return line 280, which is electrically coupled to a return terminal 104 of the RF generator to provide a return path for the RF power (e.g., to form negative electrical contacts). Each switch can also be in a disconnected state in which the respective RF output line 270 is electrically decoupled from the respective RF input line 250 and from the RF return line 280 (e.g., to form disconnected or inactive electrical contacts). The switch matrix 240 can include the switches. The state of each switch (e.g., in switch matrix 240) is controlled by respective switch control signals produced and sent from the controller 200 to the switch matrix 240.

In some embodiments, one or more of the switches can be in the connected state while the other switches are in the disconnected state to selectively power/turn on one or more contacts 260. For example, in a probe that includes 9 contacts, the switches can be configured so that only 3 of the contacts are used to provide RF ablation therapy. The state of the switches can be changed during thermal therapy to dynamically change the shape of the RF electric field and the associated lesions formed in the subject 130.

The probe 120 includes M contacts 260 where M and N (the number of variable impedance matching circuits 220, which is equal to the number of impedance detectors 230) can be the same or different. In general, M and N are positive integers and M is greater than or equal to N. For example, in a tri-polar probe (M=3), there are typically 2 impedance matching circuits and impedance detectors. In another example, in a penta-polar probe (M=5), there are typically 4 impedance matching circuits and impedance detectors. A probe used for SEEG typically includes 5, 8, 10, 12, 15, 18, or another number of contacts.

The impedance/load detectors 230 measure the impedance and/or electrical load of each contact 260 during RF ablation therapy. The impedance can be measured between contacts of the same probe 120, between contacts of adjacent probes, or relative to patient ground. The measured impedance/load is sent as an impedance feedback signal and/or as a load feedback signal from each impedance/load detector 230 to the controller 200. The controller 200 is configured to produce and send one or more impedance control signals to each impedance/load adjusting circuit 220 to set the impedance of the respective RF input lines 250 to match the measured impedance (e.g., to minimize reflected power). Adjustment of the impedance or load for each contact can be controlled directly within the impedance/load adjusting circuit 220 or within the switch matrix 240 (e.g., by adjusting the variable state of one or more switches). In other embodiments, the load for each contact can be adjusted at other points within the lesion control apparatus 110. Adjustments may be done periodically during RF therapy, such as every 1 millisecond, every 10 milliseconds, or every 100 milliseconds. Additionally or alternatively, the impedance/load adjusting circuits 220 can include or can be replaced with a thermal or temperature detector, using but not limited to the use of thermocouples, which can be located next to or integrated with the contacts 260.

In another embodiment, the impedance/load adjusting circuits 220 are adjusted by the controller 200 (e.g., via impedance control signals) so that each contact 260 receives the same power. For example, consider a tri-polar probe with a −+− configuration in contacts 1, 2, and 3, respectively. When the impedance between contacts 1 and 2 and the impedance between contacts 3 and 2 are the same, the current flow between contacts 1 and 2 and between contacts 3 and 2 is equal and the corresponding heating/lesion is symmetrical. However it is unlikely that the impedance between contacts 1 and 2 and between contacts 3 and 2 will be the same (or will remain the same during treatment). Therefore more current flow will occur between contact 2 and the return negative contact based on which negative contact (1 or 3) has the lower impedance. An increased load or impedance on one of the negative return contact will result in more current going toward the other negative return contact. In this scenario, the lesion would grow asymmetrically toward the contact (1 or 3) that has the lower impedance. As such, the impedance/load adjusting circuits 220 can increase the impedance on the negative contact (either 1 or 3) with lower impedance (or resistance), to balance the flow of power/current/heat. Differences in the impedance between negative contacts 1 and 3 and positive contact 2 may be due to variabilities in the metal(s) in the wires 250, 270 and contacts 260, length of the wires 250, 270 connected to each contact, the variability in soldering for each contact 260, localized difference in the tissue (e.g., brain tissue) through which the current flows, and/or other variabilities. Impedance differences would be further exacerbated when contacts 260 on adjacent probes are used as it would be highly unlike that contacts 1 or 3 in each probe could be implanted in the perfect geometric locations.

As an example, the variable impedances $Z_{v1}$ and $Z_{v2}$ for the tripolar case can be calculated as follows. From Ohm's Law we have:

$$I_1(Z_{v1}+Z_{c1})=I_2(Z_{v2}+Z_{c2}) \tag{i}$$

For equal power at the contacts, we have:

$$I_1^2 Z_{c1}=I_2^2 Z_{c2} \tag{ii}$$

Combining equations (i) and (ii), we have:

$$Z_{v2}=(Z_{v1}+Z_{c1})\sqrt{\frac{Z_{c2}}{Z_{c1}}}-Z_{c2} \tag{iii}$$

Choose $Z_{v1}=\max(\sqrt{Z_{c1}R_{c2}}-Z_{c1},0)$ and then use equation (iii) to calculate $Z_{v2}$. Using similar methods, it is possible to calculate the variable impedances for embodiments with asymmetric power and multiple contacts.

In another example, the impedance/load adjusting circuits 220 can be configured by the controller 200 (e.g., via impedance control signals) so that more power is selectively applied to certain contacts to adjust the shape of the ablated tissue. For example, consider a penta-polar probe with a −−+−− configuration in contacts 1, 2, 3, 4, and 5, respectively. The variable impedance adjusting circuits 220 could be arranged such that all negative contacts have the same impedance (e.g., as discussed above) or the impedance of certain contacts could be set to be different than other contacts. For example, negative contacts 1 and 5 can be set below that of negative contacts 2 and 4 such that more current flows through negative contacts 1 and 5 than through negative contacts 2 and 4, which are immediately adjacent to positive contact 3. In this embodiment, modulation of the impedance of different contacts allows the user to create a variety of gradients to achieve either larger lesions and/or different lesion morphologies.

In another embodiment, the controller 200 can be configured to monitor the impedance detected/measured by the impedance detectors 230 as feedback to determine when to stop RF ablation therapy. In an embodiment, when any of the measured impedances increases above a predetermined threshold impedance, the controller 200 causes (e.g., via switch control signals) one, some, or all of the switches (e.g., in switch matrix 240) to transition from the connected state to the disconnected state to stop RF ablation therapy. The predetermined threshold impedance can correspond to the onset or just prior to the onset of boiling or cavitation in the subject, which is undesirable. Additionally or alternatively, when the any of the measured impedances increases faster than a predetermined threshold impedance rate, the controller 200 can cause (e.g., via switch control signals) one, some, or all of the switches (e.g., in switch matrix 240) to transition from the connected state to the disconnected state to stop RF ablation therapy. The predetermined threshold impedance rate can correspond to the onset or just prior to the onset of cavitation in the subject 130.

In some embodiments, the controller 200 can be configured to stop RF ablation therapy using a combination of feedback signals. For example, the controller 700 can be electrically coupled to one or more thermocouples that is/are located near the probe 120 (e.g., near one or more respective contacts) to monitor the temperature of the subject 130 near the target area for RF ablation therapy. In another example, the controller 200 can be electrically coupled to an ultrasound imaging probe (or another imaging device) that can be used to detect the onset of cavitation. In another example, the controller 200 can be electrically coupled to a hydrophone that is located near the probe 120 to detect any sounds (e.g., cracks) associated with cavitation. The controller 200 can be configured to stop RF ablation (e.g., by controlling the state of the switches using switch control signals) based on a combination of the temperature measured by the thermocouple, ultrasound images from the ultrasound imaging probe, sounds detected by the hydrophone, and/or the measured impedance/impedance increase rate.

Figure 13:
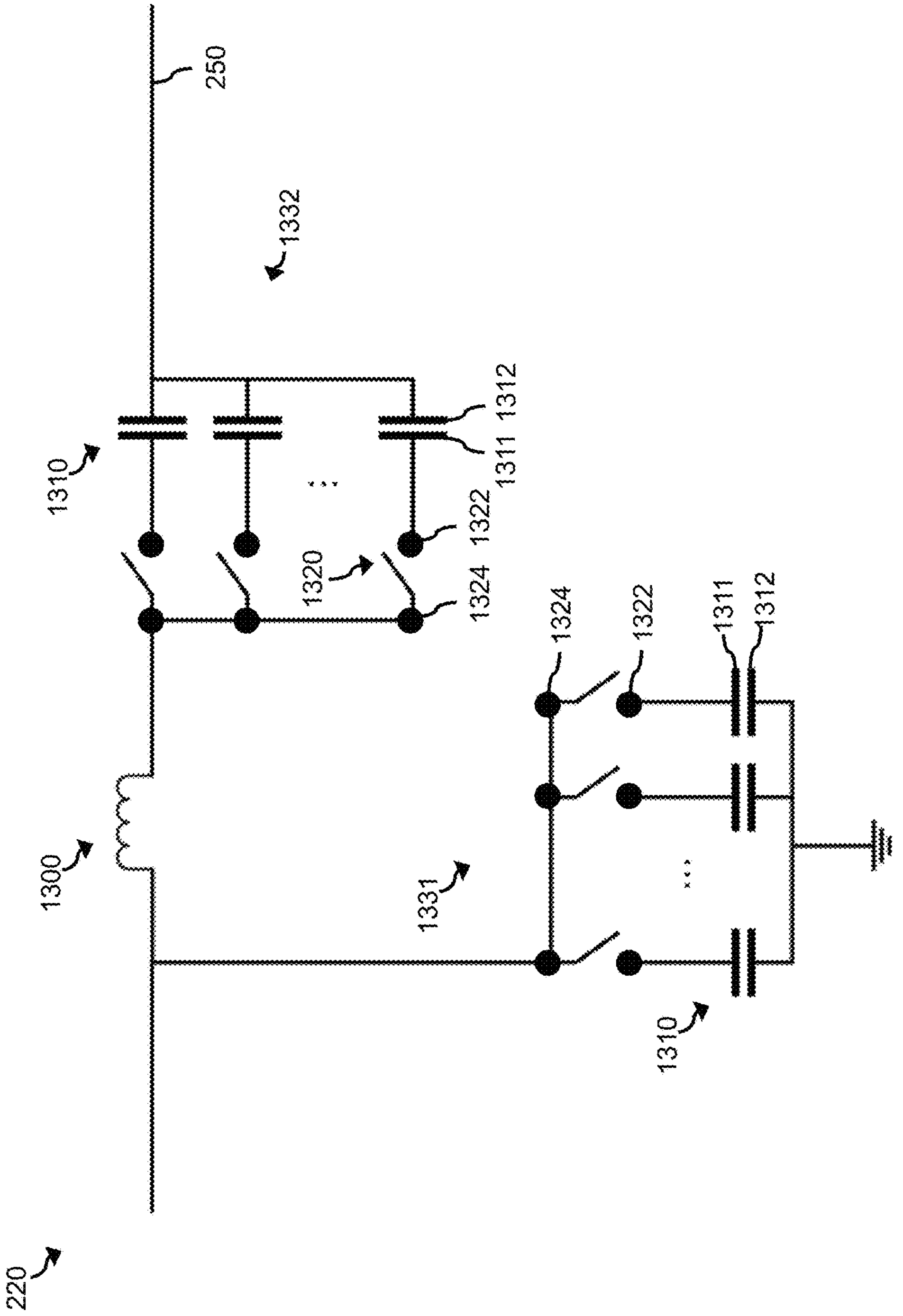
FIG. 13 is a schematic circuit diagram of the impedance/load adjusting circuit illustrated in FIGS. 2-4, according to an embodiment.

FIG. 13 is a schematic circuit diagram of the impedance/load adjusting circuit 220 according to an embodiment. The impedance/load adjusting circuit 220 includes an inductor 1300 and banks of switched capacitors 1310. Each switched capacitor 1310 is electrically coupled to a first terminal 1322 of a respective switch 1320. The inductor 1300 is electrically coupled to a second terminal 1324 of each switch 1320. The switches 1300 can be MOSFETs or other switches. When a given switch 1320 is in the closed state, the corresponding switched capacitor 1310 is electrically coupled to the inductor 1300. When a given switch 1320 is in the open state, the corresponding switched capacitor 1310 is electrically decoupled from the inductor 1300. The state of each switch 1320 can be controlled by the output signals (e.g., impedance control signals) produced by the controller 200.

In a first bank 1331 of switched capacitors 1310, a first plate 1311 of each switch capacitor 1310 is electrically coupled to the first terminal 1322 of a respective switch 1320, and a second plate 1312 of each switch capacitor 1310 is electrically coupled to ground. The switched capacitors 1310 and the respective switches 1320 are electrically coupled in parallel with each other in the first bank 1331, and the In a second bank 1332 of switched capacitors 1310, the first plate 1311 of each switch capacitor 1310 is electrically coupled to the first terminal 1322 of a respective switch 1320, and the second plate 1312 of each switch capacitor 1310 is electrically coupled to RF input line 250. The switched capacitors 1310 and the respective switches 1320 are electrically coupled in parallel with each other in the second bank 1332.

Figure 3:
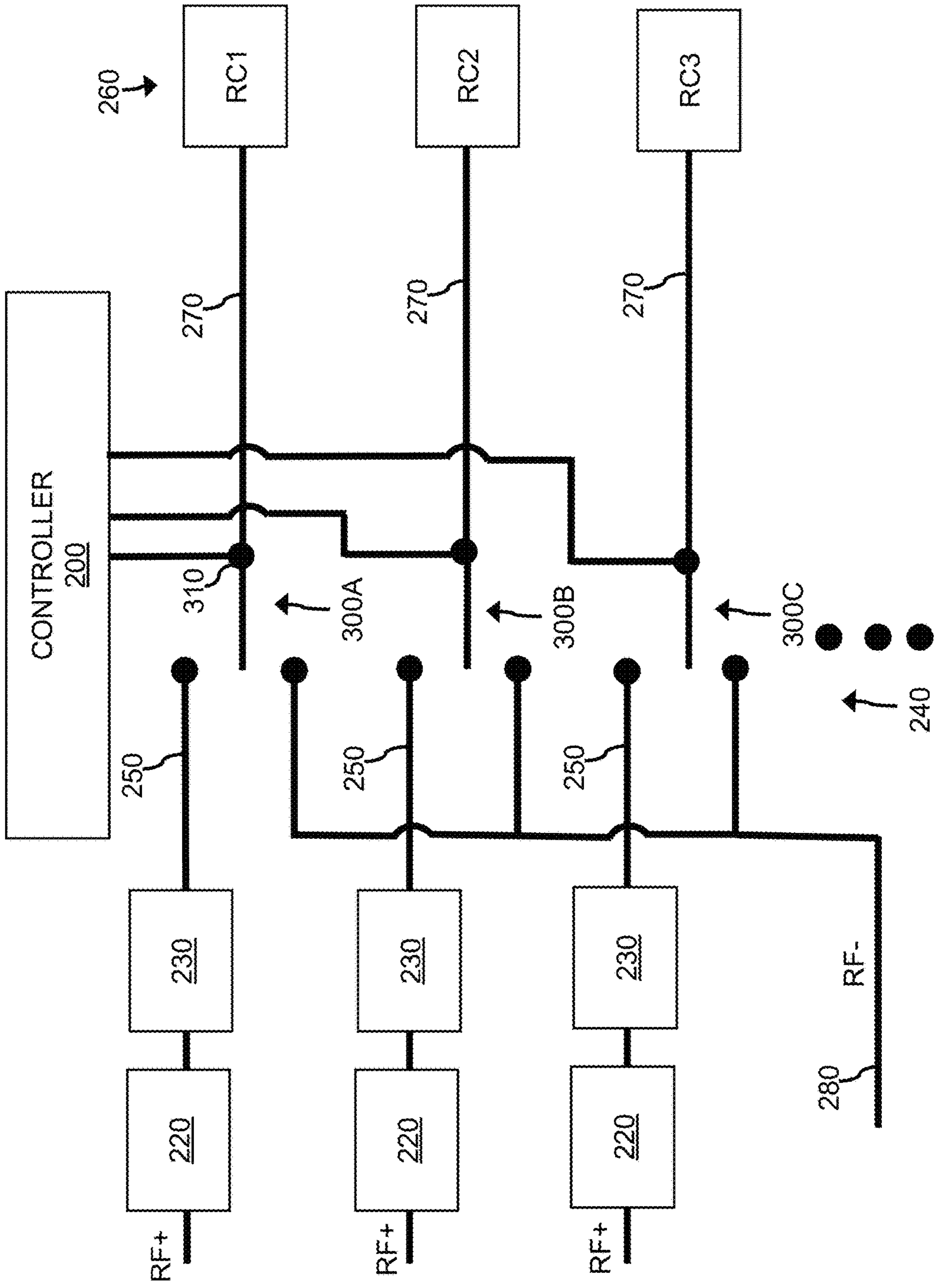
FIG. 3 is a schematic circuit diagram of a portion of the RF ablation system illustrated in FIGS. 1 and 2, according to an embodiment, with the switch matrix in a first state.

FIG. 3 is a schematic circuit diagram of a portion of system 10 including switch matrix 240 according to an embodiment. The switch matrix 240 includes a plurality of switches 300A-C (in general switches 300). Each switch 300 has a respective terminal 310 that is electrically coupled to a respective RF output line 270, which is electrically coupled to a respective one or more contacts 260. Each switch 300 can be in a connected state or a disconnected state. All switches 300 are in the disconnected state in FIG. 3. In the connected state, at least one switch 300 is electrically coupled to a respective RF input line 250 to receive RF power (e.g., RF+) from the RF generator 100 (FIGS. 1, 2) and at least one switch 300 is electrically coupled to the respective RF return line 280 to return electrical current (e.g., RF−) to the RF generator 100 to complete the circuit. Thus, each switch 300 can be in one of three states: (1) in a disconnected state, (2) in an RF power-connected state, or (3) in an RF return-connected state.

As can be seen, there are the same number of switches 300 as variable impedance matching circuits 220 and impedance detectors 230. There are N switches 300, N impedance matching circuits 220, N impedance detectors 230, and M electrical contacts 260. As discussed above, M and N are positive integers and M is greater than or equal to N.

Figure 4:
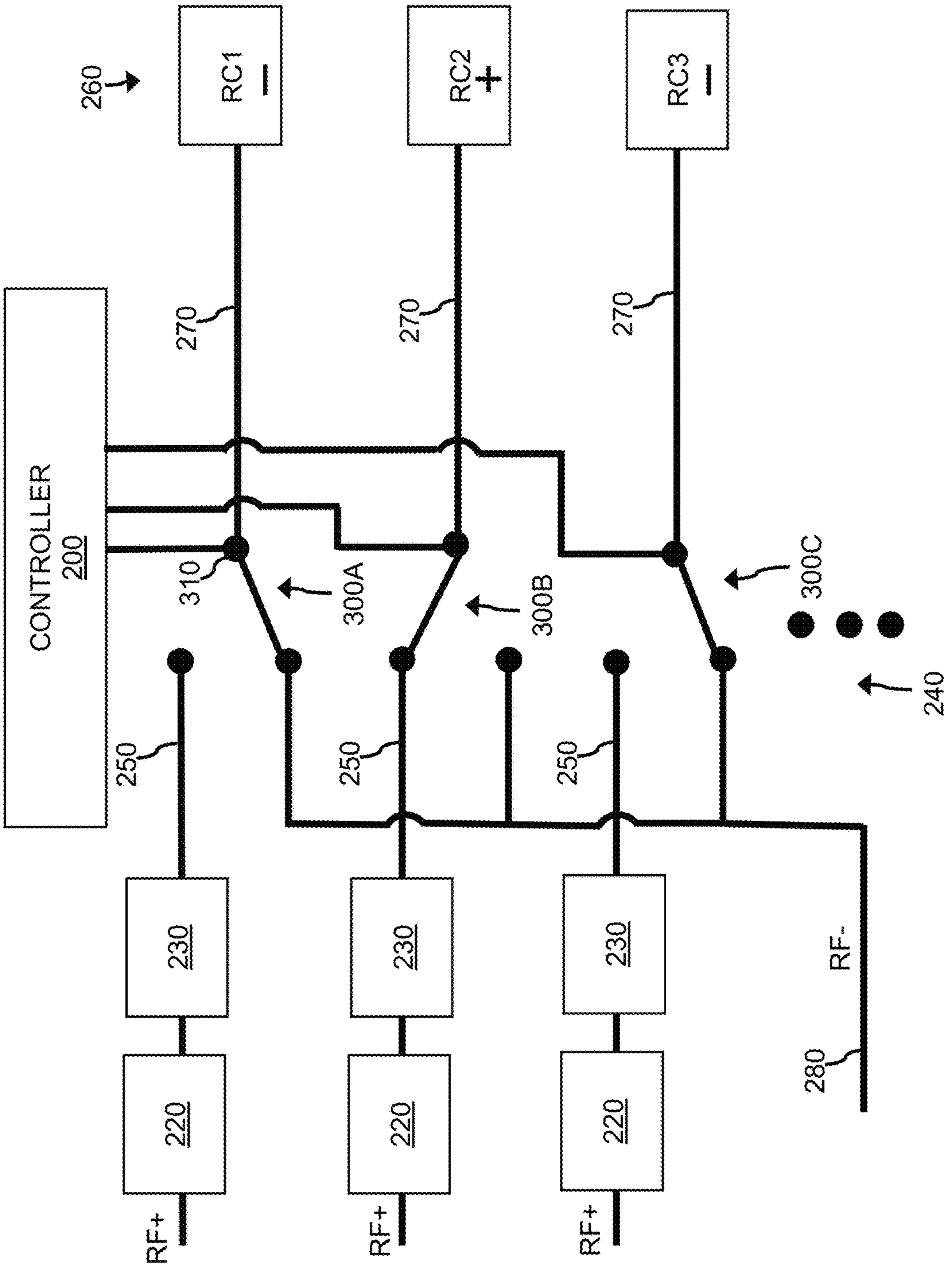
FIG. 4 is a schematic circuit diagram of a portion of the RF ablation system illustrated in FIGS. 1 and 2, with the switch matrix in a second state.

FIG. 4 is the same as FIG. 3 except that the switches 300 are in a connected state. Specifically, switches 300A and 300C are in the RF return-connected state and switch 300B is in the RF power-connected state. This switch state can be used to form a tri-polar probe with a −+− configuration of contacts 260 (i.e., RC1-3).

In some embodiments, the impedance between the positive and negative contacts (e.g., between RC2 and RC1 and/or between RC2 and RC3) can be about 257 ohms and the voltage across the positive and negative contacts can be about 37V. The current can be about 143 mA, which can result in a power of about 5.3 W.

As can be seen from FIGS. 3 and 4, the switch matrix 240 can include additional or fewer switches 300 to configure and/or form other multi-polar configurations. To form the tri-polar probe illustrated in FIGS. 3 and 4, any additional switches 300 in switch matrix 240 would be in the disconnected state.

Figure 5:
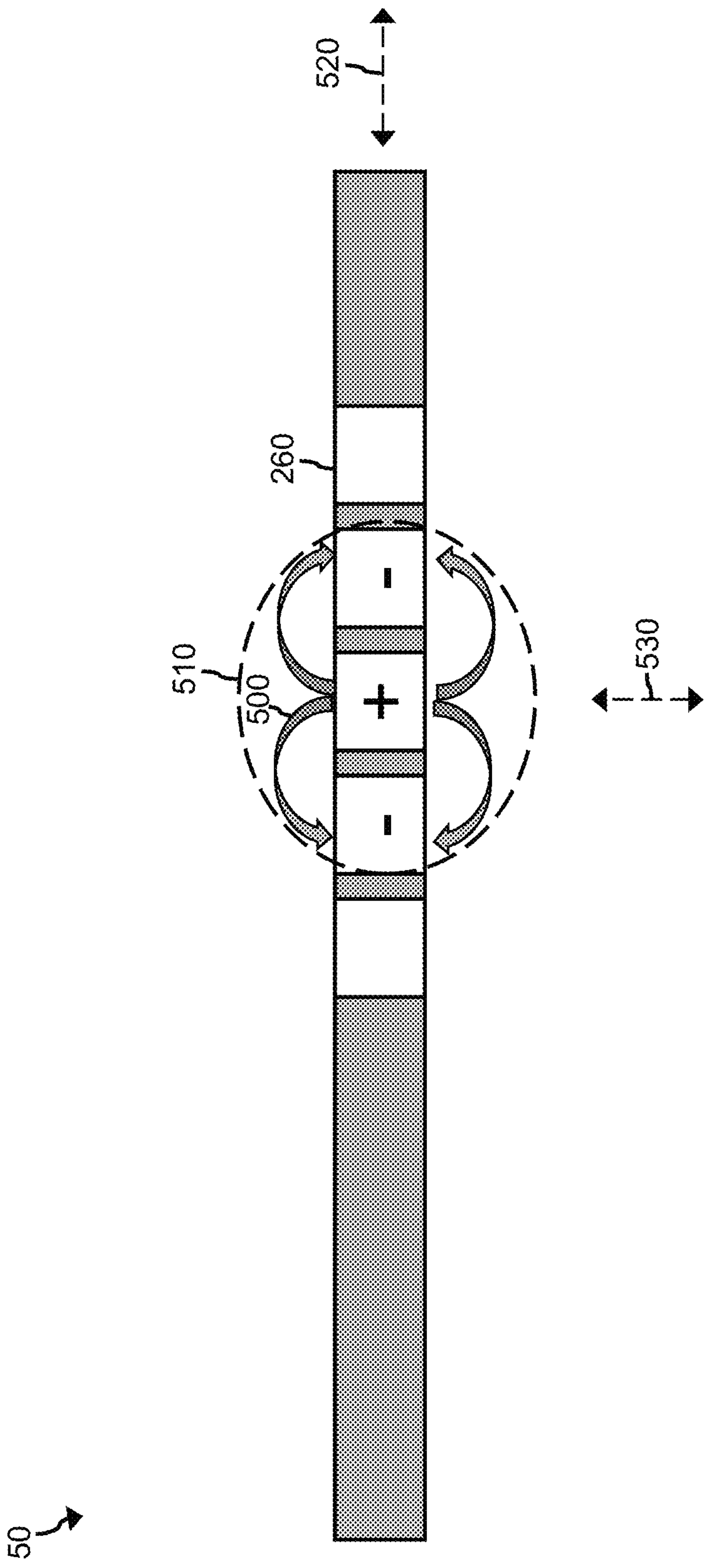
FIGS. 5-10 are block diagram of multi-polar RF probes according to different embodiments.

FIG. 5 is a block diagram of a multi-polar RF probe 50 (e.g., a penta-polar probe) in which the switches are configured to form a tri-polar probe (e.g., as discussed above with respect to FIG. 4). The outer contacts of the probe 50 are not active in the illustrated tri-polar embodiment. The RF flux 500 and the RF electric field 510 are symmetric with respect to the probe axis 520 along which the probe 50 extends. In addition, the RF flux 500 and the RF electric field 510 are symmetric with respect to a second axis 530 that passes through the positive contact 260 and that is orthogonal to the probe axis. The RF electric field 510 corresponds to the therapeutic lesion area during therapy.

Figure 6:
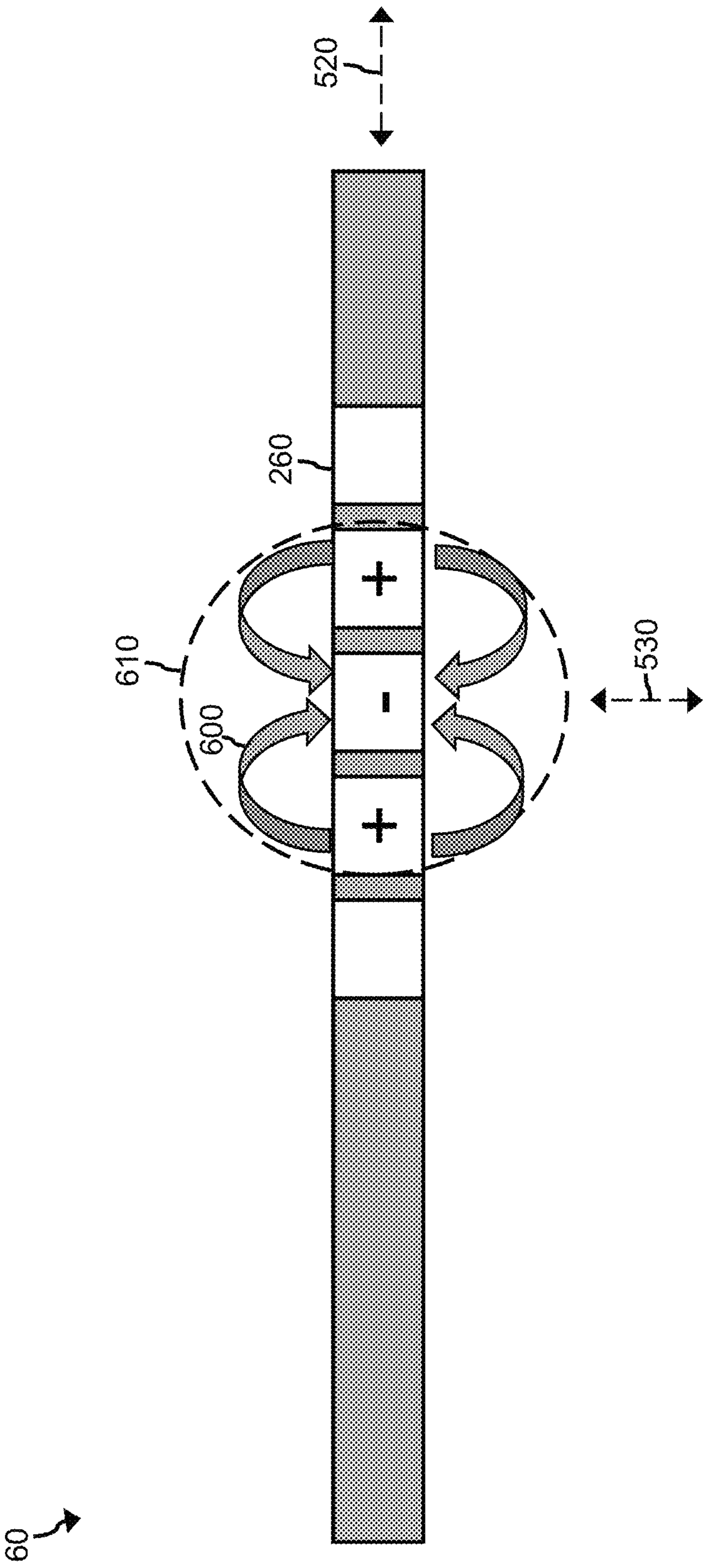

FIG. 6 is a block diagram of a multi-polar RF probe 60 (e.g., a penta-polar probe) in which the switches are configured to form a tri-polar probe where the polarities of the contacts 260 are the opposite to those of probe 50. The negative contact 260 is electrically coupled to the RF return line 280 (FIGS. 2-4) and the positive contacts 260 are electrically coupled to the RF input line 250 (FIGS. 2-4). In other words, the switch 300 (FIGS. 3, 4) that is electrically coupled to the negative contact 260 is in an RF return-connected state. The switches 300 that are electrically coupled to the positive contacts 260 are in an RF power-connected state.

The RF flux 600 and the RF electric field 610 are symmetric with respect to axes 520, 530. The RF flux 610 is wider with respect to axis 530 than RF flux 510.

Figure 7:
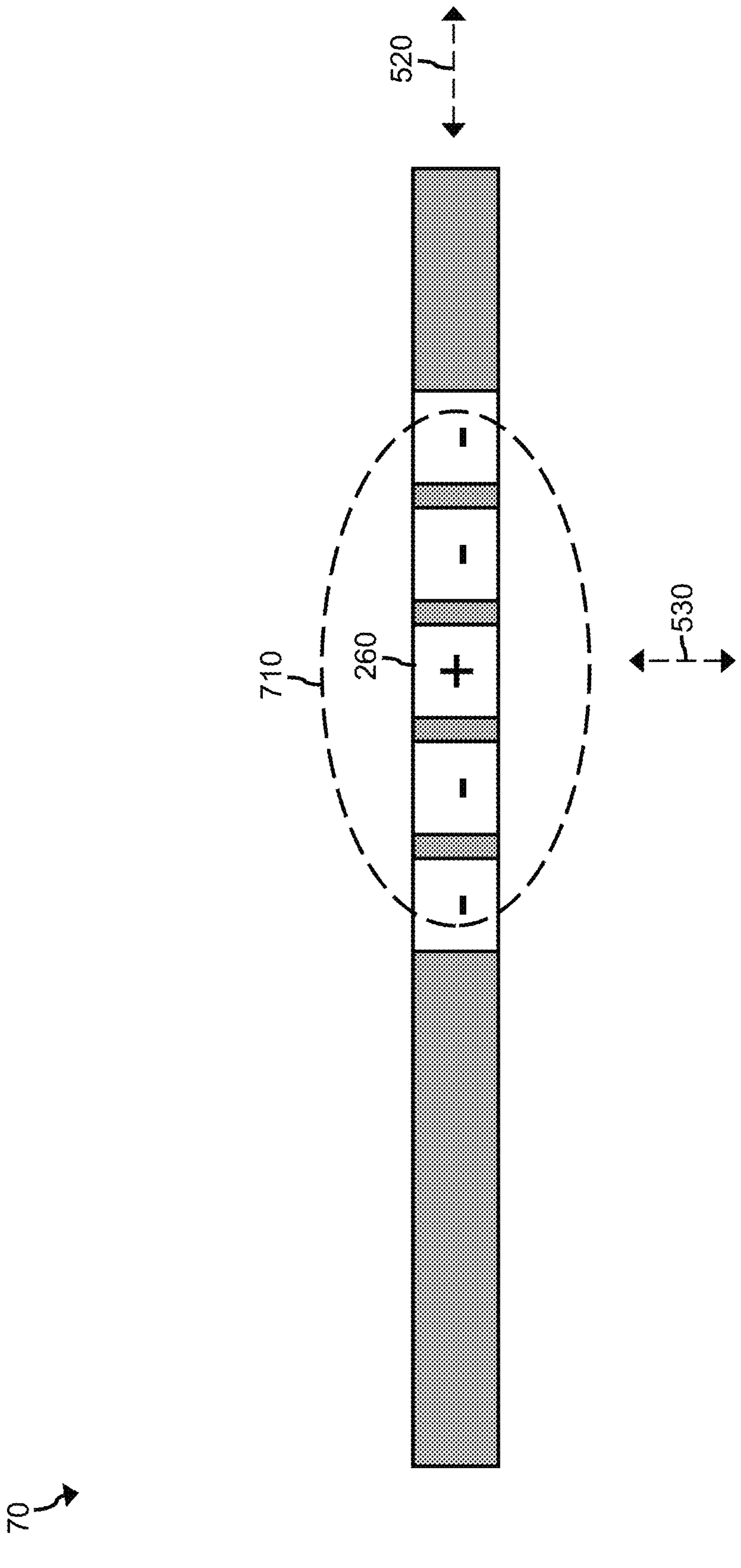

FIG. 7 is a block diagram of a multi-polar RF probe 70 (e.g., a penta-polar probe) having a −−+−− configuration. The negative contacts 260 are electrically coupled to the RF return line 280 (FIGS. 2-4) and the positive contact 260 is electrically coupled to an RF input line 250 (FIGS. 2-4). In other words, the switches 300 (FIGS. 3, 4) that are electrically coupled to the negative contacts 260 are in an RF return-connected state. The switch 300 that is electrically coupled to the positive contact 260 is in an RF power-connected state.

The RF flux (not illustrated) and the RF electric field 710 are symmetric with respect to axes 520, 530. The RF electric field 710 is longer with respect to axis 520 than RF electric fields 510, 610 (FIGS. 5, 6) and narrower with respect to axis 530 than RF electric fields 510, 610.

Figure 8:
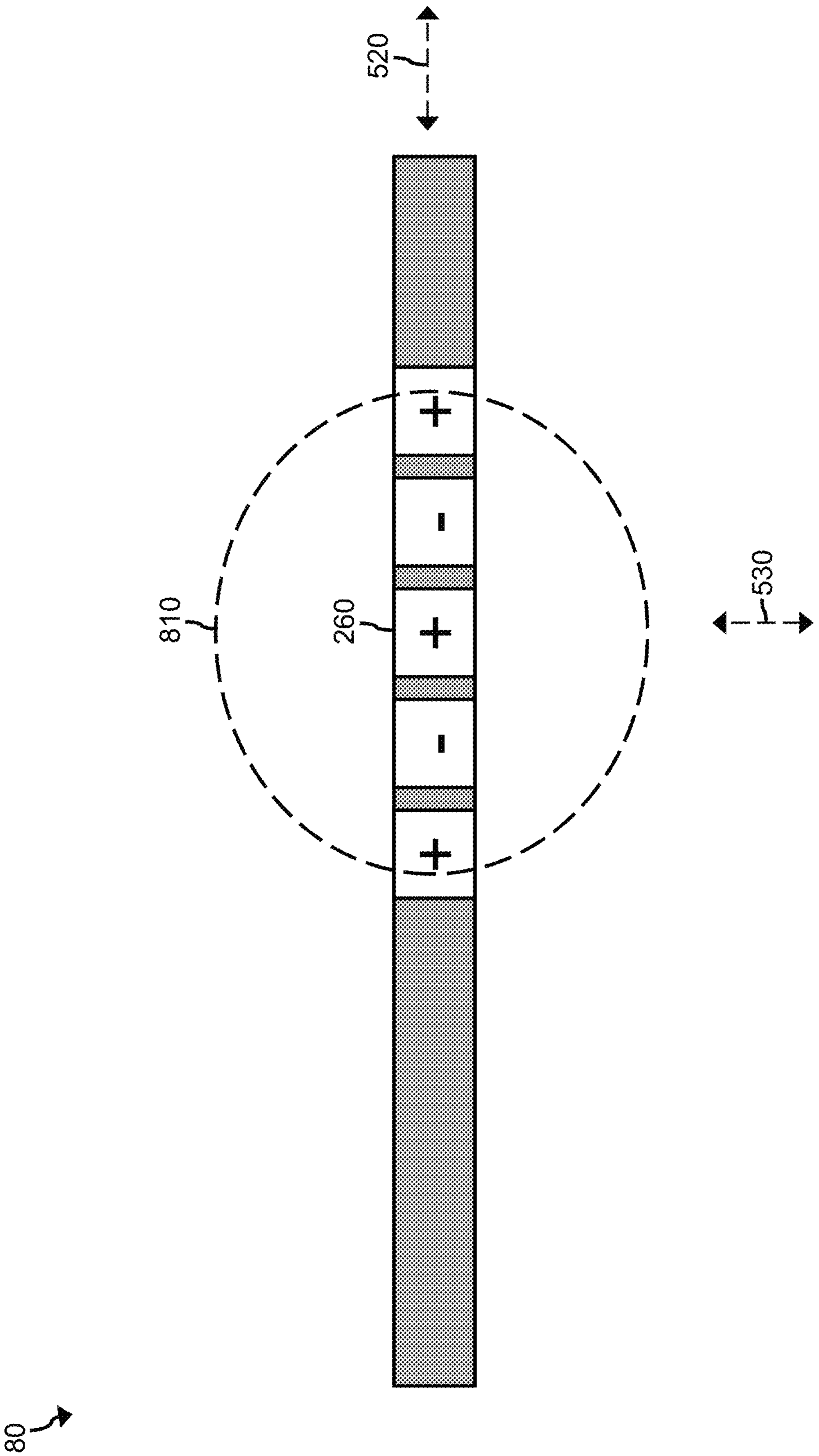

FIG. 8 is a block diagram of a multi-polar RF probe 80 (e.g., penta-polar probe) having a +−+−+ configuration. The negative contacts 260 are electrically coupled to the RF return line 280 (FIGS. 2-4) and the positive contacts 260 are electrically coupled to respective RF input lines 250 (FIGS. 2-4). In other words, the switches 300 (FIGS. 3, 4) that are electrically coupled to the negative contacts 260 are in an RF return-connected state. The switches 300 that are electrically coupled to the positive contacts 260 are in an RF power-connected state.

The RF flux (not illustrated) and the RF electric field 810 are symmetric with respect to axes 520, 530. The RF electric field 810 is wider with respect to axis 530 than RF electric fields 510, 610, 710. The RF electric field 810 is the same or about the same length with respect to axis 520 as RF electric field 710.

Figure 9:
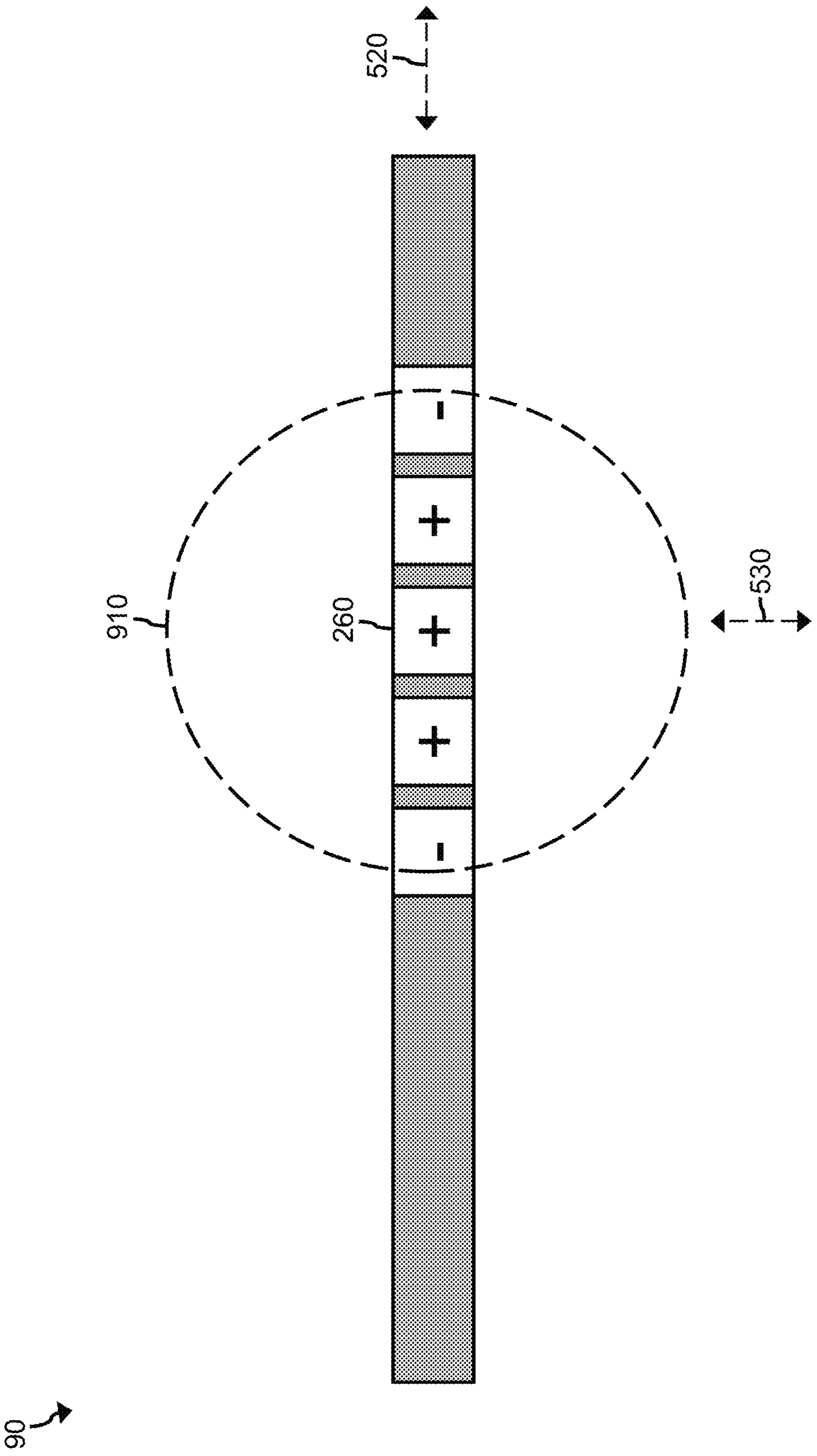

FIG. 9 is a block diagram of a multi-polar RF probe 90 (e.g., a penta-polar probe) having a −+++− configuration. The negative contacts 260 are electrically coupled to the RF return line 280 (FIGS. 2-4) and the positive contacts 260 are electrically coupled to respective RF input lines 250 (FIGS. 2-4). In other words, the switches 300 (FIGS. 3, 4) that are electrically coupled to the negative contacts 260 are in an RF return-connected state. The switches 300 that are electrically coupled to the positive contacts 260 are in an RF power-connected state.

The RF flux (not illustrated) and the RF electric field 910 are symmetric with respect to axes 520, 530. The RF electric field 910 is wider with respect to axis 530 than RF electric fields 510, 610, 710, 810. The RF electric field 910 is the same or about the same length with respect to axis 520 as RF electric fields 710, 810.

Figure 10:
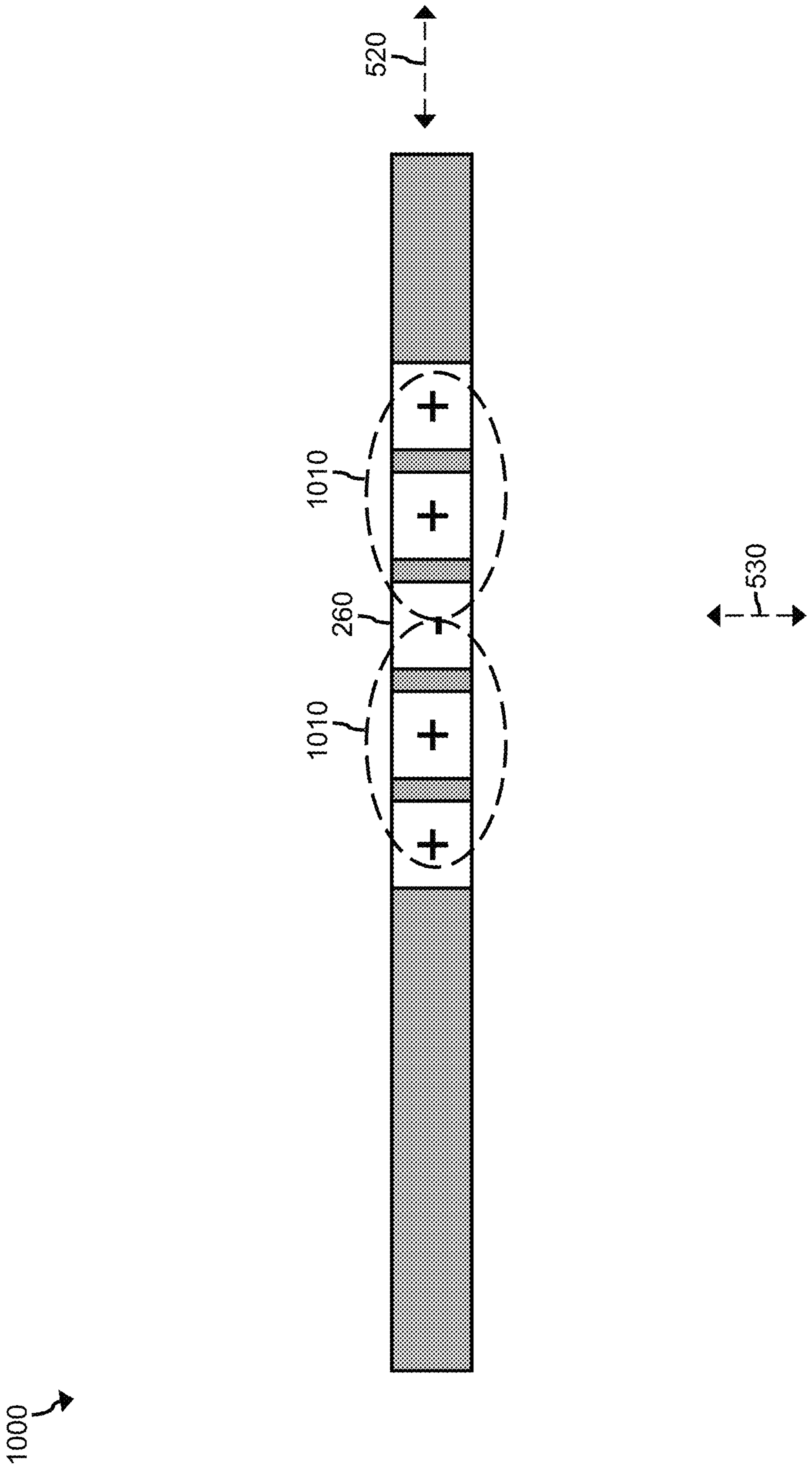

FIG. 10 is a block diagram of a multi-polar RF probe 1000 (e.g., a penta-polar probe) having a ++−++ configuration. The negative contact 260 is electrically coupled to the RF return line 280 (FIGS. 2-4) and the positive contacts 260 are electrically coupled to respective RF input lines 250 (FIGS. 2-4). In other words, the switch 300 (FIGS. 3, 4) that is electrically coupled to the negative contact 260 is in an RF return-connected state. The switches 300 that are electrically coupled to the positive contacts 260 are in an RF power-connected state.

The RF flux (not illustrated) and the RF electric field 1010 are symmetric with respect to axes 520, 530. The RF electric field 1010 is the same or about the same width with respect to axis 530 as RF electric field 710. The RF electric field 1010 is the same or about the same length with respect to axis 520 as RF electric fields 710, 810, 910.

The multi-polar probes 50, 60, 70, 80, 90, 1000 can include additional contacts. For example, another embodiment of the probe can have a repeating pattern of 2 negative contacts and 1 positive contact (e.g., +−−+−−+−−). Alternatively, a third negative contact can be added to the proximal and distal sides of the positive contact 260 in probe 60 (e.g., −−−+−−−). In another embodiment of probe 70, the repeating pattern of positive and negative contacts can be extended to 7 contacts (e.g., +−+−+−+) and so on (e.g., the number of contacts being a positive odd integer greater than 5). Alternatively, the contact configuration of probes 70 and 80 be combined (e.g., −−+−−+−+− or another combination). Other contact configurations are possible.

Figure 11:
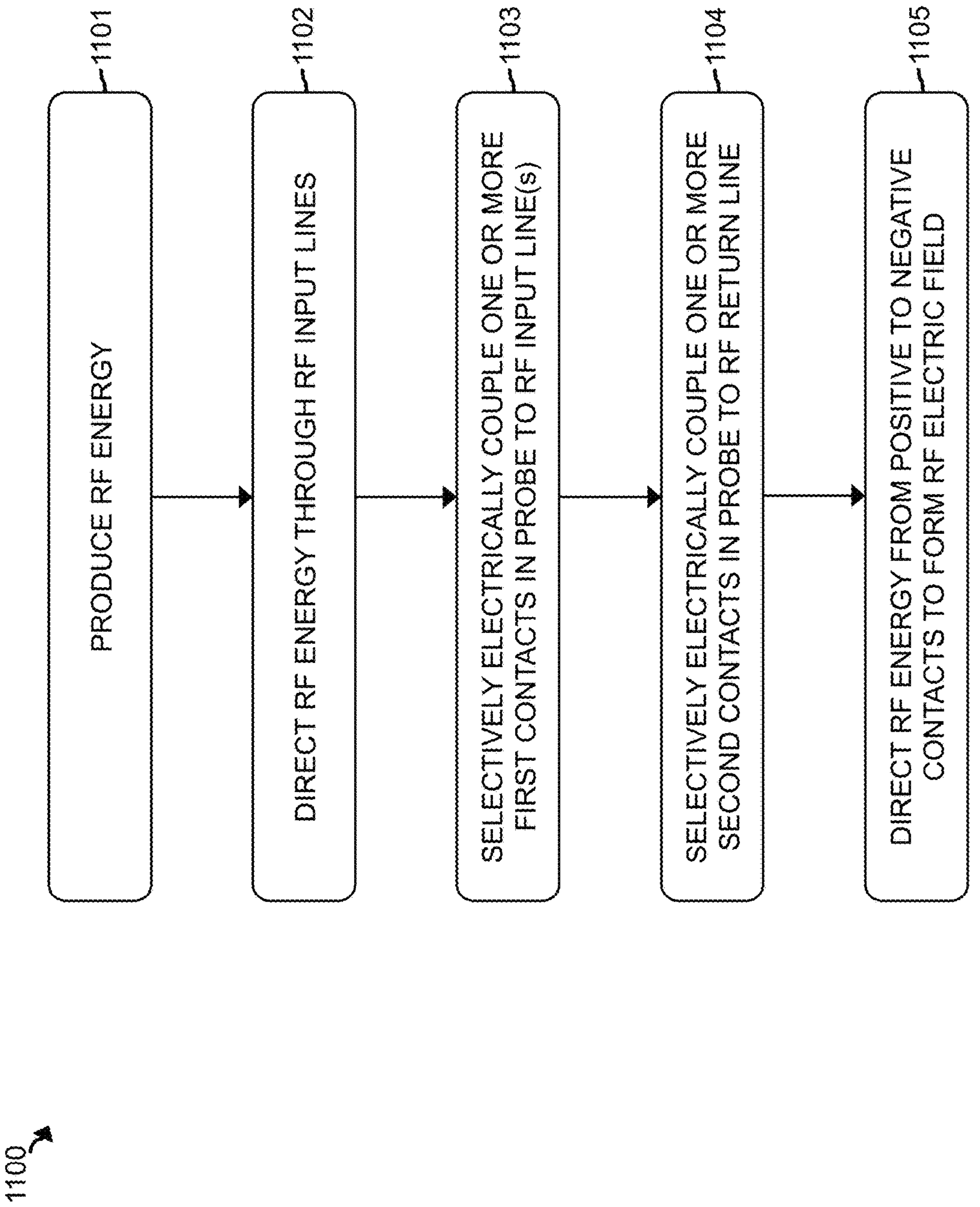
FIG. 11 is a flow chart of a method for operating a multi-polar RF ablation probe according to an embodiment.

FIG. 11 is a flow chart of a method 1100 for operating a multi-polar RF ablation probe according to an embodiment. Method 1100 can be performed using system 10 (FIGS. 1-4) and/or multi-polar RF ablation probes 120, 50, 60, 70, 80, 90, or 1000.

In step 1101, RF energy is produced with an RF generator such as RF generator 100. The RF energy has a predetermined or target RF frequency and power. The predetermined or target RF frequency can be in the range of about 400 KHz to about 500 KHz. In other embodiment, the predetermined or target RF frequency can be less than about 400 KHz or greater than about 500 KHz. The predetermined or target RF power can be in the range of about 4 W to about 10 W. In other embodiment, the predetermined or target RF power can be less than about 4 W or greater than about 10 W.

In step 1102, the RF energy is directed or flowed through a plurality of RF input lines (e.g., RF input lines 250) that are electrically coupled to an output terminal of the RF generator. The RF input lines can be electrically connected in parallel with each other.

In step 1103, with one or more first switches that is/are each electrically coupled to one or more respective first electrical contacts in a multi-polar RF ablation probe, each first switch selectively electrically couples the respective first electrical contact(s) to a respective RF input lines to form one or more positive electrical contacts. The first switches can be the same as switches 300 which can form a switch matrix 240. The first electrical contacts can be the same as electrical contacts 240 and/or RC1, RC2, RC3, etc. The multi-polar RF ablation probe can be the same as multi-polar RF ablation probe 120, 50, 60, 70, 80, 90, or 1000. The first switches are in an RF power-connected state in this step.

In step 1104, with one or more second switches that is/are each electrically coupled to one or more respective second electrical contacts in the multi-polar RF ablation probe, each second switch selectively electrically couples the respective first electrical contact(s) to an RF return line that is electrically coupled to a return terminal of the RF generator to form one or more negative electrical contacts. The RF return line can be the same as RF return line 280.

In step 1105, RF energy is directed from the positive electrical contact(s) to the negative electrical contact(s) to produce a therapeutic RF electric field (e.g., RF electric field 510, 610, 710, 810, 910, or 1010).

In some embodiments, the method includes selectively electrically decoupling one or more third electrical contacts in the multi-polar RF ablation probe from the respective RF input line and from the RF return line to form one or more disconnected or inactive electrical contacts.

In some embodiments, the method further includes while producing the therapeutic RF electric field, changing a state of a first one of the first switches from (a) an RF power-connected state to (b) an RF return-connected state to dynamically change a polarity of the respective one or more first electrical contacts that is/are electrically coupled to the first one of the switches. In the RF power-connected state, the first one of the first switches electrically couples the respective one or more first electrical contacts to the respective RF input line. In the RF return-connected state, the first one of the first switches electrically couples the respective one or more first electrical contacts to the RF return line.

In some embodiments, the method further includes producing, with a controller (e.g., controller 200) electrically coupled to the one or more first switches and to the one or more second switches, first and second switch control signals to set a state of the one or more first switches and a state of the one or more second switches. The state can be an RF power-connected state, an RF return-connected state, or a disconnected state.

In some embodiments, a plurality of impedance detectors (e.g., impedance detectors 230) and variable impedance matching circuits (e.g., variable impedance matching circuits 220) are electrically coupled to respective RF input lines and the method further includes measure the impedance of the respective electrical contact(s) that is/are electrically coupled to each respective RF input line. The controller is configured to send a respective impedance control signal to each variable impedance matching circuit to set an impedance of a respective RF output line (e.g., RF output line 270) based on the respective measured impedance. Each RF output line is electrically coupled to (a) a respective switch (e.g., first or second switch) and the one or more respective electrical contacts.

The respective impedance control signal can cause each variable impedance matching circuit to match the impedance of the respective RF output line to the impedance of the respective electrical contact(s) that is/are electrically coupled to the respective RF output line. Alternatively, the respective impedance control signal can cause each variable impedance matching circuit to vary the impedance of the respective RF output line to balance a current flow to the respective first and second electrical contacts. Alternatively, the respective impedance control signal can cause each variable impedance matching circuit to vary the impedance of the respective RF output line to unevenly flow current to the respective first and second electrical contacts.

The method can further include monitoring, with the controller, the impedance of the respective electrical contact(s) (e.g., first and second electrical contacts) during an RF ablation therapy procedure. When the impedance of the respective one, some, or all of the electrical contact(s) is higher than a predetermined threshold impedance, the controller can cause the RF ablation therapy to stop. For example, the controller can send a stop signal to the RF generator to stop producing RF energy. Additionally or alternatively, the controller can send switch control signals that cause all of the switches to transition to the disconnected state.

Figure 12:
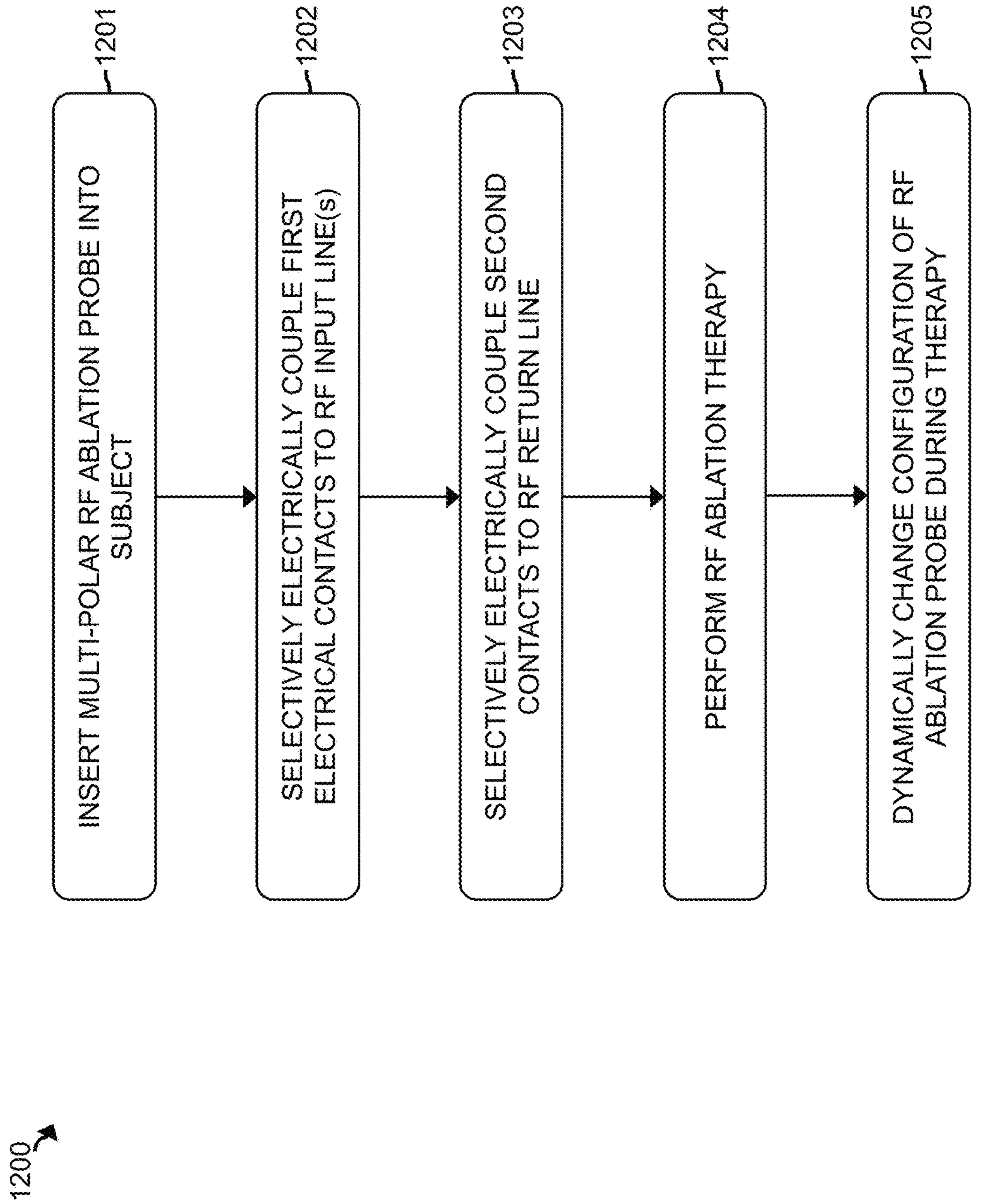
FIG. 12 is a flow chart of a method for performing RF ablation therapy according to an embodiment.

FIG. 12 is a flow chart of a method 1200 for performing RF ablation therapy according to an embodiment. Method 1200 can be performed using system 10 (FIGS. 1-4) and/or multi-polar RF ablation probes 120, 50, 60, 70, 80, 90, or 1000.

In step 1201, a multi-polar RF ablation probe is inserted into a subject. For example, the multi-polar RF ablation probe (e.g., multi-polar RF ablation probe 120, 50, 60, 70, 80, 90, or 1000) can be inserted in or near the patient's brain to perform a SEEG procedure.

In step 1202, one or more first electrical contacts in the multi-polar RF ablation probe is/are selectively electrically coupled to one or more RF input lines. The first electrical contacts can be selectively electrically coupled to the RF input line(s) using one or more switches. The switch(es) can transition from a disconnected state to an RF power-connected state in this step. The RF input line(s) is/are electrically coupled to an output terminal of an RF generator. The first electrical contacts are configured as positive electrical contacts in this step.

In step 1203, one or more second electrical contacts in the multi-polar RF ablation probe is/are selectively electrically coupled to one or more RF return lines. The second electrical contacts can be selectively electrically coupled to the RF return line(s) using one or more switches. The switch(es) can transition from a disconnected state to an RF return-connected state in this step. The RF return line(s) is/are electrically coupled to a return terminal of an RF generator. The second electrical contacts are configured as negative electrical contacts in this step.

In step 1204, RF ablation therapy is performed for example by generating RF energy with the RF generator and forming a therapeutic lesion in a target area.

In step 1205, the configuration of the multi-polar RF ablation probe is changed dynamically while RF ablation therapy is performed in step 1204. The configuration can be changed by adding positive and/or negative electrical contacts to the multi-polar RF ablation probe, changing the polarity of one or more electrical contacts, and/or deactivating one or more positive and/or negative electrical contacts.

To add an additional positive electrical contact, an inactive electrical contact is selectively electrically coupled to a respective RF input line, for example by using a switch that is electrically coupled to the inactive electrical contact. The respective switch can transition from a disconnected state to an RF power-connected state to add the additional positive electrical contact.

To add an additional negative electrical contact, an inactive electrical contact is selectively electrically coupled to the RF return line, for example by using a switch that is electrically coupled to the inactive electrical contact. The respective switch can transition from a disconnected state to an RF return-connected state to add the additional negative electrical contact.

To change the polarity of a positive electrical contact, the corresponding first electrical contact is selectively electrically decoupled from the respective RF input line and selectively electrically coupled to the RF return line. The respective switch can transition from an RF return-connected state to an RF power-connected state to change the polarity of a positive electrical contact.

To change the polarity of a negative electrical contact, the corresponding second electrical contact is selectively electrically decoupled from the RF return line and selectively electrically coupled to the respective RF input line. The respective switch can transition from an RF return-connected state to an RF power-connected state to change the polarity of a negative electrical contact.

To deactivate a positive electrical contact, the corresponding first electrical contact is selectively electrically decoupled from the respective RF input line. The respective switch can transition from an RF power-connected state to a disconnected state to deactivate a positive electrical contact.

To deactivate a negative electrical contact, the corresponding second electrical contact is selectively electrically decoupled from the respective RF return line. The respective switch can transition from an RF return-connected state to a disconnected state to deactivate a negative electrical contact.

The invention should not be considered limited to the particular embodiments described above. Various modifications, equivalent processes, as well as numerous structures to which the invention may be applicable, will be readily apparent to those skilled in the art to which the invention is directed upon review of this disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of this application need not reside on a single computer or processor but may be distributed in a modular fashion among a number of different computers or processors to implement various aspects of this application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the disclosure and claims include new and novel improvements to existing methods and technologies, which were not previously known nor implemented to achieve the useful results described above. Users of the method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A lesion control system comprising:

a radio-frequency (RF) generator that produces RF energy having a predetermined frequency and power;

a controller comprising a microprocessor;

a multi-polar RF ablation probe having a plurality of electrical contacts;

a plurality of RF input lines electrically coupled to an output terminal of the RF generator;

a plurality of RF output lines, each RF output line electrically coupled to a respective one or more of the electrical contacts in the multi-polar RF ablation probe;

an RF return line electrically coupled to a return terminal of the RF generator; and a plurality of switches, each switch having a respective terminal electrically coupled to a respective RF output line, each switch electrically coupled to the controller, wherein the controller is configured to produce switch control signals that change a respective state of one or more of the switches to set a configuration of the multi-polar RF ablation probe; and wherein the switch control signals are first switch control signals and the controller is configured to produce second switch control signals during an RF ablation therapy to dynamically change the configuration of the multi-polar RF ablation probe.

2. The system of claim 1, wherein the controller is configured to produce control signals that cause a first one or more of the switches to transition to an RF power-connected state in which the first one or more of the switches electrically couple one or more respective RF output lines to one or more respective RF input lines to form one or more respective positive contacts.

3. The system of claim 2, wherein the controller is configured to produce control signals that cause a second one or more of the switches to transition to an RF return-connected state in which the second one or more of the switches electrically couple one or more respective RF output lines to the RF return line to form one or more respective negative contacts.

4. The system of claim 3, wherein the controller is configured to produce control signals that cause a third one or more of the switches to transition to a disconnected state in which the third one or more of the switches is/are electrically decoupled from one or more respective RF input lines and from the RF return line to form one or more disconnected contacts.

5. The system of claim 3, wherein the second switch control signals that are produced during an RF ablation therapy to dynamically change the configuration of the multi-polar RF ablation probe change a state of a first one of the first one or more switches from (a) an RF power-connected state in which the first one of the first one or more switches electrically couples one of the electrical contacts of the multi-polar RF ablation probe to one of the RF input lines to (b) an RF return-connected state in which the first one of the first one or more switches electrically couples the one of electrical contacts of the multi-polar RF ablation probe to the RF return line.

6. The system of claim 5, wherein the controller is configured to produce the second switch control signals while a therapeutic RF electric field is produced.

7. The system of claim 1, wherein the controller is configured to produce the second switch control signals while a therapeutic RF electric field is produced.

8. A lesion control system comprising:

a radio-frequency (RF) generator that produces RF energy having a predetermined frequency and power;

a controller comprising a microprocessor;

a multi-polar RF ablation probe having a plurality of electrical contacts;

a plurality of RF input lines electrically coupled to an output terminal of the RF generator;

a plurality of RF output lines, each RF output line electrically coupled to a respective one or more of the electrical contacts in the multi-polar RF ablation probe;

an RF return line electrically coupled to a return terminal of the RF generator; and a plurality of switches, each switch having a respective terminal electrically coupled to a respective RF output line, each switch electrically coupled to the controller, wherein the controller is configured to produce switch control signals that change a respective state of one or more of the switches to set a configuration of the multi-polar RF ablation probe;

the system further comprising:

a plurality of variable impedance matching circuits;

a plurality of impedance detectors, each impedance detector having an input electrically coupled to an output of a respective variable impedance matching circuit and an output electrically coupled to an input of the controller, wherein each variable impedance matching circuit and each impedance detector are electrically coupled to a respective RF input line.

9. The system of claim 8, wherein:

each impedance detector is configured to measure a respective measured impedance of the respective one or more of the electrical contacts and to send a respective output signal to the controller that represents the respective measured impedance of the respective one or more electrical contacts, and the controller is configured to send respective impedance control signals to each variable impedance matching circuit to set an impedance of the respective RF output line based on the respective measured impedance.

10. The system of claim 9, the respective impedance control signals cause each variable impedance matching circuit to match the impedance of the respective RF output line to the respective measured impedance.

11. The system of claim 9, wherein the respective impedance control signals cause each variable impedance matching circuit to vary the impedance of the respective RF output line to balance a current flow to the electrical contacts.

12. The system of claim 9, wherein the respective impedance control signals cause each variable impedance matching circuit to vary the impedance of the respective RF output line to unevenly flow current to the electrical contacts.

13. The system of claim 9, wherein the controller is configured to produce a stop signal when the respective measured impedance is higher than a predetermined threshold impedance.

* * * * *